United States Patent [19]
Ryu et al.

[11] Patent Number: 5,488,732
[45] Date of Patent: Jan. 30, 1996

[54] AUTOMATIC SUPPORT TOOL GENERATING SYSTEM BASED ON A KNOWLEDGE ACQUISITION TOOL AND A DATABASE

[75] Inventors: Tadamitsu Ryu; Gen Kakehi; Shigeru Aoe, all of Kawasaki, Japan

[73] Assignee: Fujitsu Network Engineering Limited, Kawasaki, Japan

[21] Appl. No.: 328,572

[22] Filed: Oct. 24, 1994

Related U.S. Application Data

[63] Continuation of Ser. No. 778,442, Oct. 17, 1991, abandoned.

[30] Foreign Application Priority Data

Oct. 18, 1990 [JP] Japan .................. 2-280335

[51] Int. Cl.$^6$ ........................ G06F 15/20; G06F 15/40
[52] U.S. Cl. ................ 395/800; 395/600; 364/DIG. 1;
364/282.1; 364/283.4
[58] Field of Search ...................... 395/275, 800,
395/75–77, 600, 650, 22, 62, 949, 725

[56] References Cited

U.S. PATENT DOCUMENTS

| | | | |
|---|---|---|---|
| 4,658,370 | 4/1987 | Erman et al. | 395/12 |
| 4,800,510 | 1/1989 | Vinberg et al. | 395/140 |
| 4,853,873 | 8/1989 | Tsuji et al. | 395/77 |
| 4,864,497 | 9/1989 | Lowry et al. | 395/650 |
| 4,972,328 | 11/1990 | Wu et al. | 395/62 |
| 5,019,961 | 5/1991 | Addesso et al. | 364/192 |
| 5,175,797 | 12/1992 | Funabashi et al. | 395/22 |
| 5,197,005 | 3/1993 | Shwartz et al. | 395/600 |
| 5,204,936 | 4/1993 | Kaneko et al. | 395/919 |
| 5,208,768 | 5/1993 | Simoudis | 395/919 |

FOREIGN PATENT DOCUMENTS

| | | |
|---|---|---|
| 296426 | 12/1986 | Japan . |
| 53236 | 3/1989 | Japan . |
| 66735 | 3/1989 | Japan . |
| 202633 | 8/1990 | Japan . |

OTHER PUBLICATIONS

10th Int. Conf. Software Engineering 11 Apr. 1988, Washington, IEEE, US pp. 407–416 XP11369, Helen Sharp, *KDA–A Tool for Automatic Design Evaluation and Refinement Using the Blackboard Model of Control*.

IEEE Int. Conf. on Systems Engineering Aug. 24, 1989, Washington, IEEE, US pp. 261–264 XP89056, Ayman El Dessouki et al., *A Knowledge Based Scheme for Computer Aided Mechanical Engineering Design*.

IEE Colloquium on Control in Building Energy Management, May 30, 1990, London, IEE, UK, I.P. Duncumb, *Bespoke Control Software and Quality*.

Automatisierungstechnische Praxis–ATP, vol. 32, No. 2, Feb. 1990, Munchen DE pp. WS 1–WS22 XP125654, J. Dorn et al., *Wissensbasierte Systeme, Zusammenstellung und Beschreibung wichtiger Begriffe*.

*Primary Examiner*—Mehmet Geckil
*Attorney, Agent, or Firm*—Staas & Halsey

[57] ABSTRACT

An automatic support tool generating system includes a knowledge acquisition tool for acquiring knowledge from answers received in response to questions generated by the knowledge acquisition tool, and a database for storing the knowledge acquired by the knowledge acquisition tool as data and for forming a knowledge data group, where the knowledge acquisition tool acquires, based on attribute data which are obtained as the answers, a design support knowledge data group used for generating a design support tool which is necessary to make a desired design. The knowledge acquisition tool includes a general design sequence input processing part for inputting a general design related to mutual relationships of macro attribute data which form the design support knowledge data group, a detailed design sequence input processing part for inputting micro attribute data which form the macro attribute data, a data input/output condition input processing part for inputting input conditions and/or output conditions related to the micro attribute data, and a check condition input processing part for inputting check conditions which are necessary for the desired design by making links among the micro attribute data.

8 Claims, 7 Drawing Sheets

FIG. 7

( USER - BUILDING - EQUIPMENT - SENSOR - FUNCTION - ESTIMATE - DOCUMENT )  — 9

| USER NAME | CENTRALIZED/ DECENTRALIZED | POSITION ON FLOOR | SWITCH | DEMAND | NO. OF SENSORS | PROPOSAL |
|---|---|---|---|---|---|---|
| LOCATION | NO. OFF FLOORS | PBX | HEAT SENSOR | POWER ON/OFF | NO. OF EQUIPMENTS | USER MANUAL |
| NECESSITY | ATTRIBUTE OF EACH FLOOR | LAN | SMOKE SENSOR | AIR CONDITIONER | CPU | . |
| CAPITAL | EXTERNAL APPEARANCE | CPU | THERMOMETER | FREEZER | DOUBLE SYSTEM | . |
| CHARACTER-ISTIO | PLAN VIEW | LINE SET | HYGROMETER | HEAT SINK | DECENTRALIZED | . |
| KEYMAN NAME | . | AIR CONDITIONER | RADAR | COOLING TOWER | | . |
| GROSS SALES | . | LAMP | IMAGE SENSOR | HUMIDIFIER | | . |
| . | . | SWITCH | INFRARED SENSOR | FAN | | . |
| . | | HEAT SENSOR | . | LAMP | | |
| . | | SMOKE SENSOR | . | | | |
| | | VENTILATION OUTLET | | SCHEDULE | | |
| | | VENTILATION FAN | | FIRE PREVENTION | | |
| | | COOLER | | CRIME PREVENTION | | |
| | | BOOSTER | | . | | |
| | | FAN | | . | | |
| | | LIGHT | | | | |
| | | CAMERA | | | | |
| | | GRAPHIC PANEL | | | | |
| | | DESK | | | | |
| | | . | | | | |
| | | . | | | | |
| | | . | | | | |

10

AUTOMATIC SUPPORT TOOL GENERATING SYSTEM BASED ON A KNOWLEDGE ACQUISITION TOOL AND A DATABASE

This application is a continuation, of application Ser. No. 07/778,442, filed Oct. 17, 1991, now abandoned.

BACKGROUND OF THE INVENTION

The present invention generally relates to support tool generating systems, and more particularly to an automatic support tool generating system which automatically generates a design support tool, in a knowledge acquisition system or an expert system which acquires knowledge using a knowledge acquisition tool.

When designing a building management system, for example, the kind of information to be collected and how the information is to be collected come into question.

Conventionally, a knowledge engineer must install a desired knowledge database. In other words, an expert on building management system, for example, determines individually matters such as how the building is to be arranged and which equipment is to be provided.

FIG.1 shows a conventional system for forming a knowledge database. A data processing system 100, shown in FIG. 1, includes a knowledge database 101 and an inference processing mechanism 102.

Conventionally, an expert on building management systems, for example, stores in the knowledge database 101 the kinds of information required when designing a building management system. Then, the inference processing mechanism 102 copes with the demands from a client, who requests the design of a building management system, by referring to the contents of the knowledge database 101. The inference processing mechanism 102 carries out processes such as outputting questions to the client when further information is required from the client.

Therefore, it is essential that the knowledge database 100 be supported by the expert or knowledge 1 engineer. That is, the knowledge database 100 is formed based on the knowledge of the expert, and it takes an extremely long time and large effort to form the knowledge database 101. Further, even if the knowledge database 101 is completed to a certain extent, the contents of the knowledge database 101 are not always sufficient. For this reason, the knowledge database 101 must continue to be supported by the expert.

SUMMARY OF THE INVENTION

Accordingly, it is a general object of the present invention to provide a novel and useful automatic support tool generating system in which the problems described above are eliminated.

Another and more specific object of the present invention is to provide an automatic support tool generating system comprising a knowledge acquisition tool for generating questions, receiving answers to those questions and acquiring knowledge from those answers. The automatic support tool generating system further comprises a database for storing the knowledge acquired by the knowledge acquisition tool as data and for forming a knowledge data group, where the knowledge acquisition tool acquires, based on attribute data which are obtained as the answers, a design support knowledge data group used for generating a design support tool which is necessary to make a desired design. The knowledge acquisition tool includes a general design sequence input processor for inputting a general design related to mutual relationships of macro attribute data which form the design support knowledge data group, a detailed design sequence input processor for inputting micro attribute data which form the macro attribute data, a data input/output condition input processor for inputting input conditions and/or output conditions related to the micro attribute data, and a check condition input processor for inputting check conditions which are necessary for the desired design by linking the micro attribute data. According to the automatic support tool generating system of the present invention, it is possible to automatically generate the design support tool. After the design support tool is generated, the desired design can be completed by merely inputting the primitives of the attribute data.

Other objects and further features of the present invention will be apparent from the following detailed description when read in conjunction with the accompanying drawings.

BRIEF DESCRIPTION OF THE DRAWINGS

FIG. 7 is a diagram for explaining attribute data.

DESCRIPTION OF THE PREFERRED EMBODIMENTS

Figure 1:
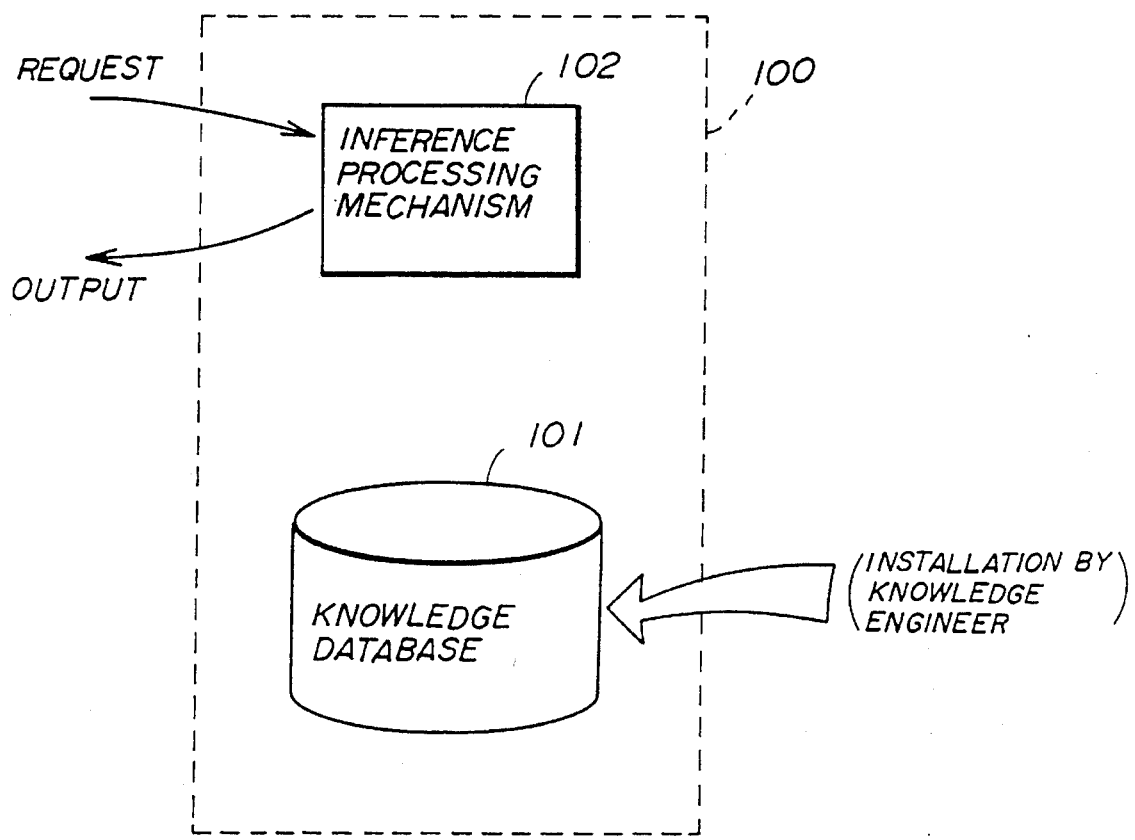
FIG. 1 is a system block diagram showing a conventional system for forming a knowledge database.

First, a description will be given of an operating principle of the present invention, by referring to FIG. 2. A data processing system 100, shown in FIG. 2, includes a knowledge database 101 and a knowledge acquisition tool 1. The knowledge acquisition tool 1 includes a general design sequence input processor 3, a detailed design sequence input processor 4, a data input/output condition input processor 5, a check condition input processor 6, and a final input condition/input format automatic generation processor 7. The knowledge database 101 includes a design support tool (or a design support knowledge data group) 2, a design support tool name 8, a macro attribute data group 9 made up of macro attribute data 9-i, a micro attribute data group 10 made up of micro attribute data 10-i, data input/output conditions 11, and check conditions 12.

The general design sequence input processor 3 inputs and stores various kinds of macro attribute data 9-i. For example, in a case where a design tool of a building management system is to be obtained as the design tool 2, the macro attribute data 9-i includes (i) information related to units, (ii) information related to the building, (iii) information related to equipments, (iv) information related to various sensors, (v) information related to required functions, (vi) information related to the estimate, (vii) information related to documents to be output and the like.

The detailed design sequence input processor 4 inputs and stores various kinds of micro attribute data 10-i. With respect to the macro attribute data 9-i which corresponds to the above described information (ii) related to the building, the micro attribute data 10-i includes questions such as (a) is the management to be centralized or decentralized?, (b) how many floors are to be built?, (c) how is each floor constructed?, (d) how should the external appearance of the building look?, and (e) what are the plan views of each of the floors?.

The data input/output condition input processor 5 gives the conditions related to each micro attribute data 10-i. For example, with respect to the micro attribute data 10-i corresponding to the above described plan view (e), the data input/output condition input processor 5 gives conditions such as which floor the plan view to be output is related to and whether the kinds and positions of sensors provided on the floor should be indicated on this plan view. Furthermore, the micro attribute data 10-i gives various kinds of conditions such as the conditions under which the micro attribute data 10-i needs to be input when inputting the micro attribute data 10-i in the knowledge database 101, and the conditions under which the micro attribute data 10-i needs to be output when displaying the micro attribute data 10-i on a display device or the like.

The check condition input processor 6 gives various kinds of check conditions such as whether an exhaust fan should be set up and linked when setting up heat sensors and smoke sensors.

The final input condition/input format automatics generation processor 7 carries out such processing as making a list of input conditions, including the information which needs to be finally input when designing the building management system, and making an estimate.

Figure 2:
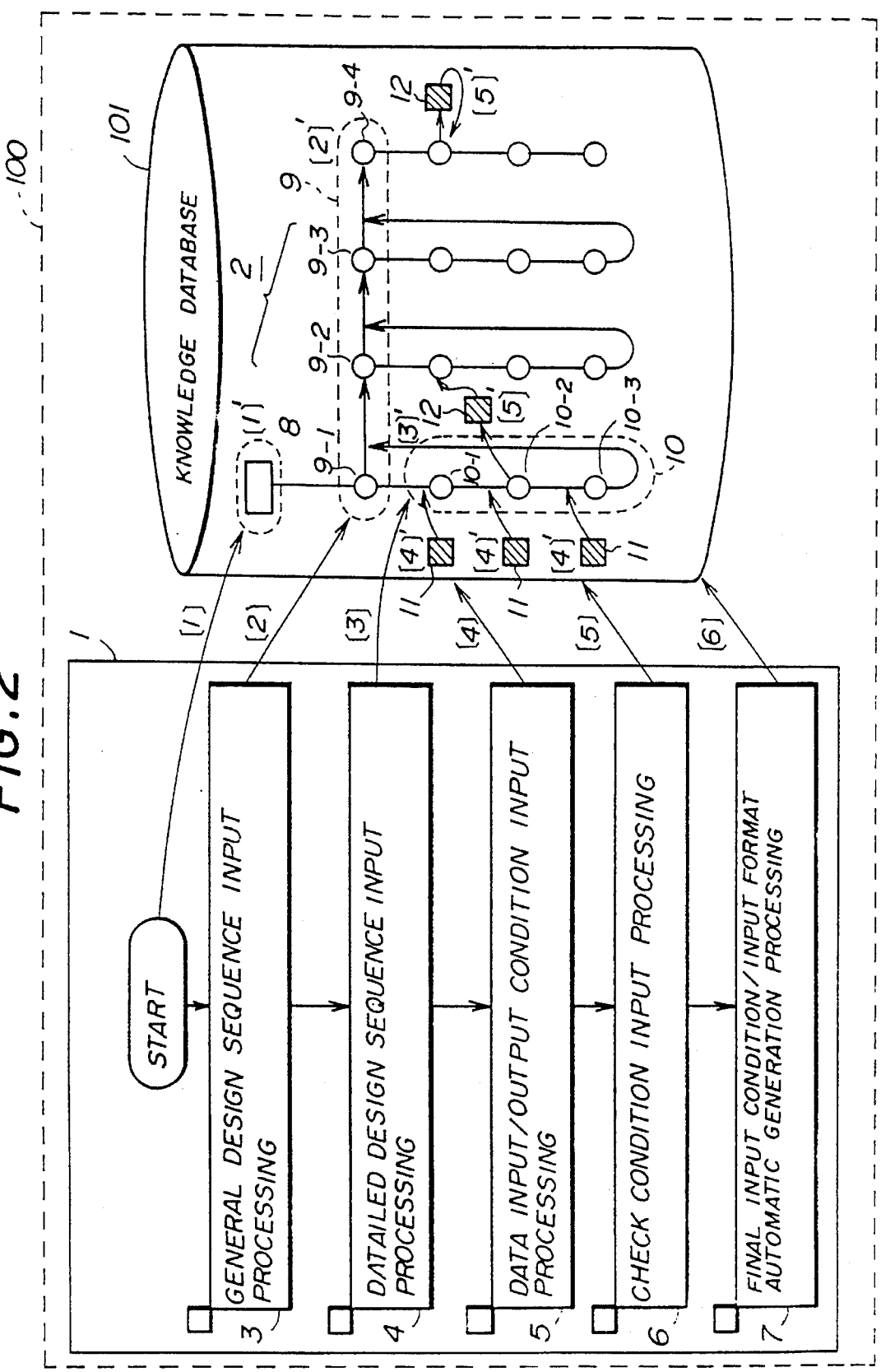
FIG. 2 is a system block diagram for explaining an operating principle of the present invention.

When the knowledge acquisition tool 1 is started, an instruction is generated requesting the name 8 of the design acquisition tool 2, as indicated by processes [1] and [1]' in FIG. 2. Then, the general design sequence input processor 3 requests the input of the macro attribute data 9-i. When the macro attribute data 9-i are input, the macro attribute data 9-i are stored, in the knowledge database 101, in the form of a network type structure as the macro attribute data group 9, as indicated by processes [2] and [2]' shown in FIG. 2.

Next, the detailed design sequence input processor 4 instructs the input of the micro attribute data 10-i. When the micro attribute data 10-i are input, the micro attribute data 10-i are stored in the knowledge database 101 in the form of a tree type structure as the micro attribute data group 10, as indicated by processes [3] and [3]'.

The data input/output condition input processor 5 generates an instruction to input the data input/output conditions 11 corresponding to each of the micro attribute data 10-i. The data input/output conditions 11, which are input are stored in the knowledge database 101 in the form of a relational type data structure, as indicated by processes [4] and [4]'.

The check condition input processor 6 inputs the check conditions 12 and stores the check conditions 12 in the knowledge database 101 in the form of a hyper type data structure, as indicated by processes [5] and [5]'. The check conditions 12 may be given with respect to the individual micro attribute data 10-i or with respect to a link which links a plurality of micro attribute data 10-i.

The final input condition/input format automatic generation processor 7 uses the design support knowledge data group stored within the knowledge database 101, and carries out a process such as generating a document, as indicated by a process [6].

Next, a description will be given of a process of using the generated design support tool, by referring to FIG. 3.

Figure 3:
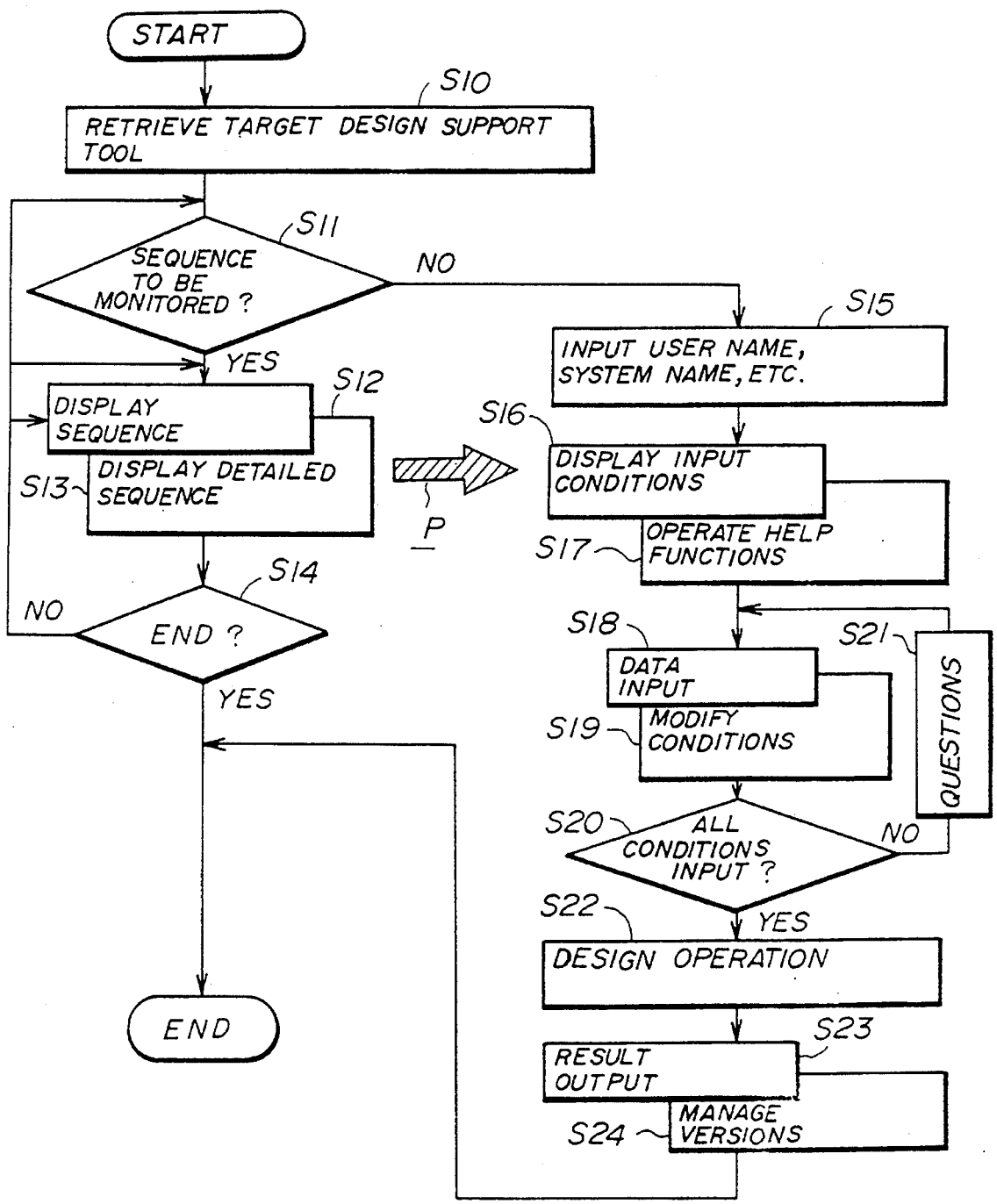
FIG. 3 is a flow chart for explaining a process for using a design support tool which is generated.

In FIG. 3, step S10 retrieves the target design support tool using the name of the design tool and the like. Step S11 decides whether the sequence of the table of contents is to be monitored. If the decision result in step S11 is YES, step S12 displays the sequence of the table of contents and step S13 displays the detailed sequence id necessary. In FIG. 3, an arrow P indicates that the mode can be changed from this display state to another state which will be described later with regard to steps S16 and S17. Step S14 decides whether the display is to be ended, and the process ends if the decision result in step S14 is YES. On the other hand, the process returns to step S11 if the decision result in step S14 is NO.

If there is no need to monitor the sequence of the table of contents, the decision result in step S11 is NO. In this case, step S15 inputs the user name, the system name such as the name of the design support tool and the like. Step S16 displays the conditions under which the input process is to be carried out, and step S17 operates various help functions to help the operator carry out the input process if necessary.

Step S18 inputs the data corresponding to the design support tool 2 or corresponding to the instruction from the design support tool 2. Step S19 modifies the conditions if necessary. Step S20 decides whether all of the conditions and the like are input, that is, whether the input process is ended. If the decision result in the step S20 is NO, the design support tool 2 poses various questions to the operator in step S21, and the process returns to step S18.

On the other hand, if the decision result in step S20 is YES, step S22 carries out the design operation. Then, step S23 outputs the result of the design operation, and step S24 manages the version number and the like. The process ends after step S24.

Figure 4:
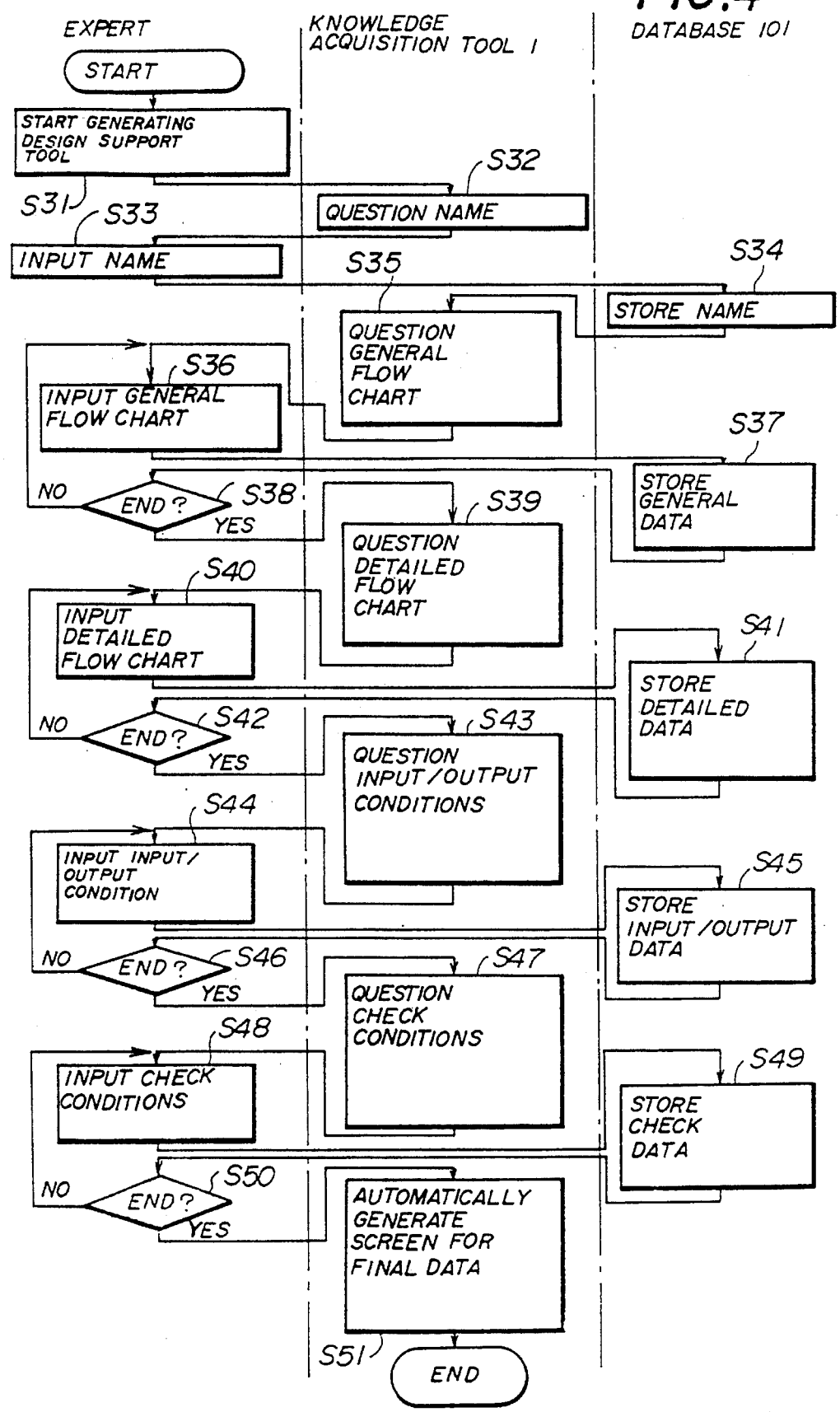
FIG. 4 is a flow chart for explaining a process of generating the design support tool.

Next, a description will be given of a process of generating a design support tool, by referring to FIG. 4. In FIG. 4, the steps in the left column indicate the processes of the expert when forming the design support tool 2, the steps in the center column indicate the processes of the knowledge acquisition tool 1, and the steps in the right column indicate the processes of the knowledge database 101.

When the process of generating the design support tool is started in step S31 shown in FIG. 4, the design knowledge acquisition tool 1 questions the name in step S32, and the expert (knowledge engineer) inputs the name in step S33. The knowledge database 101 stores the name in step S34.

Then, the knowledge acquisition tool 1 questions the general design flow chart corresponding to the general design sequence input processor 3 in step S35. When the expert inputs the answers to the questions in step S36, the knowledge database 101 stores the answers as the macro attribute data 9-i in step S37. Step S38 decides whether or not all inputs have been made with respect to the macro attribute data 9-i, that is, whether the input with respect to the macro attribute data 9-i is ended by an instruction from the expert. The process returns to step S36 if the decision result in step S38 is NO.

If the decision result in the step S38 is YES, the knowledge acquisition tool 1 questions the detailed design flow chart corresponding to the detailed design sequence input processor 4 in step S39. When the expert inputs the answers to the questions in step S40, the knowledge database 101 stores the answers as the micro attribute data 10-i in step S41. Step S42 decides whether all inputs have been made with respect to the micro attribute data 10-i, that is, whether the input with respect to the micro attribute data 10-i is ended by an instruction from the expert. The process returns to step S40 if the decision result in step S42 is NO.

If the decision result in step S42 is YES, the knowledge acquisition tool 1 questions the data input/output conditions corresponding to the data input/output condition input processor 5 in step S43. When the expert inputs the answers to the questions in step S44, the knowledge database 101 stores the answers as the data input/output conditions in step S45. Step S46 decides whether or not all inputs have been made with respect to the data input/output conditions, that is, whether the input with respect to the data input/output conditions is ended by an instruction from the expert. The process returns to step S44 if the decision result in step S46 is NO.

On the other hand, if the decision result in step S46 is YES, the knowledge acquisition tool 1 questions the check conditions corresponding to the check condition input processor 6 in step S47. When the expert inputs the answers to the questions in step S48, the knowledge database 101 stores the answers as the check conditions in step S49. Step S50 decides whether all inputs have been made with respect to the check conditions, that is, whether the input with respect to the check conditions is ended by an instruction from the expert. The process returns to step S48 if the decision result in step S50 is NO. But if the decision result in step S50 is YES, the knowledge acquisition tool 1 automatically generates the screen or display for the final data in step S51 and the process ends.

The knowledge acquisition tool 1 may judge whether a necessary content is missing in the data display screen. In this case, the knowledge acquisition tool 1 generates a question related to the missing content, so that the missing content can be added on the data display screen.

Figure 5:
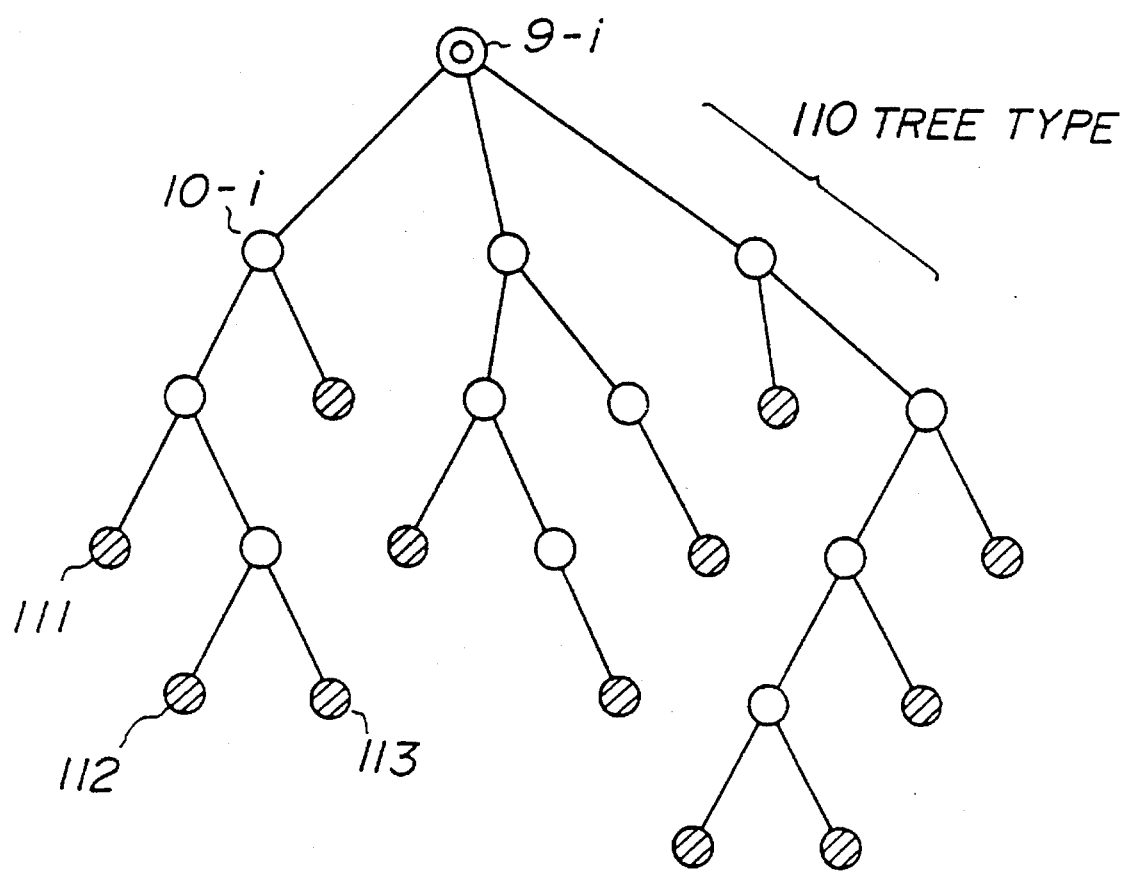
FIG. 5 is a diagram for explaining a data input in the process shown in FIG. 3.

FIG. 5 is a diagram for explaining the data input step S18 in the process shown in FIG. 3. The data which are input in step S18 correspond to primitives 111, 112, 113, . . . at the final end of an attribute data group 110 which has a tree structure. In the case of a data "telephone set", for example, the primitive specifies the specific information such as "telephone set model number YY manufactured by company ZZ". Hence, in the case of designing the building management system and the plan view of the first floor is displayed, for example, the display indicates the position where the "telephone set model number YY manufactured by company ZZ" is to be set up.

Figure 6:
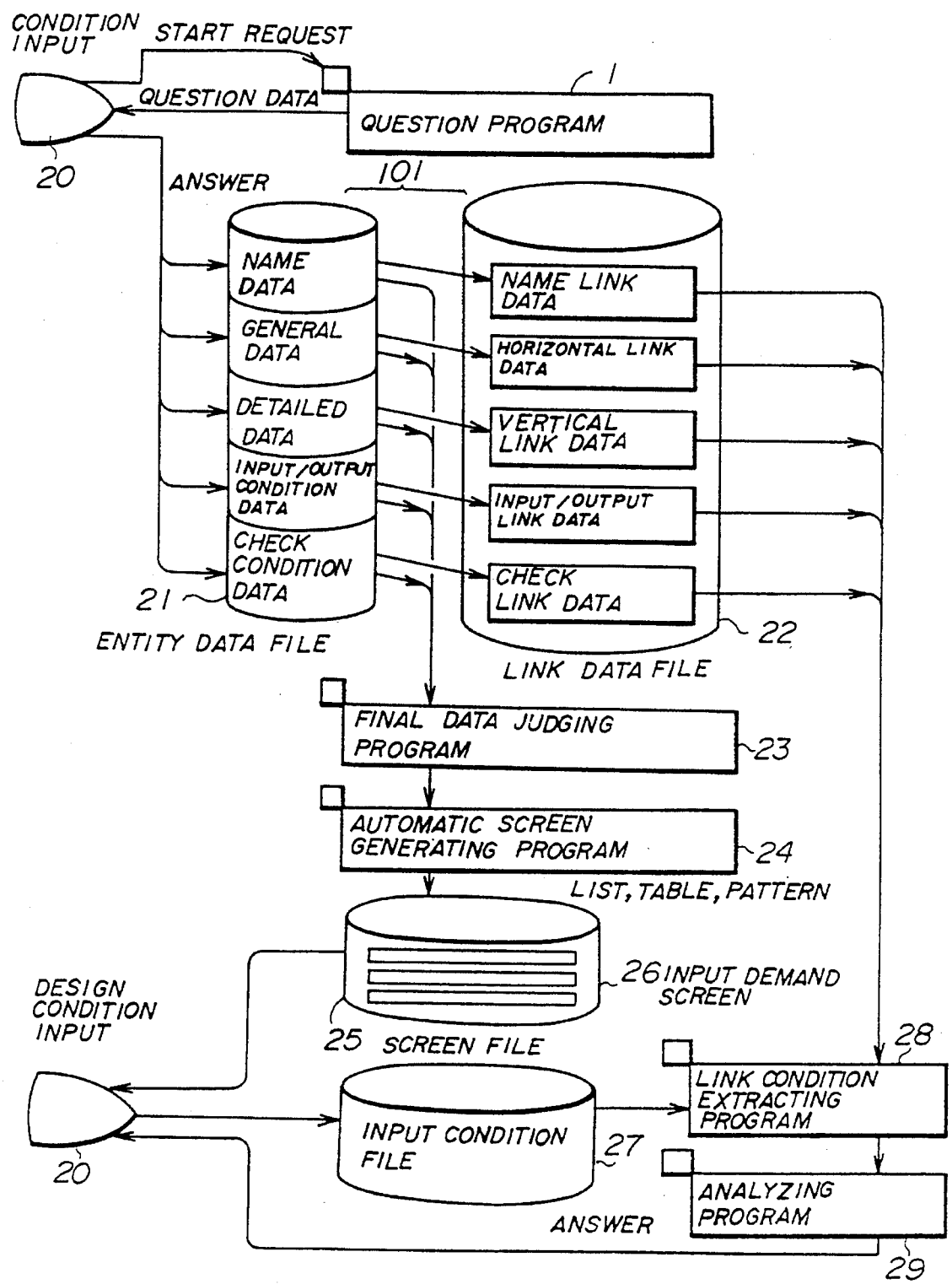
FIG. 6 is a system block diagram showing an embodiment of an automatic support tool generating system according to the present invention.

FIG. 6 shows an embodiment of the automatic support tool generating system according to the present invention. In FIG. 6, those parts which are basically the same as those corresponding parts in FIG. 2 are designated by the same reference numerals, and a description thereof will be omitted.

The support tool generating system shown in FIG. 6 includes a knowledge acquisition tool (question program) 1, a knowledge database 101, terminal equipment 20, an entity data file 21, a link data file 22, a final data judging program 23, an automatic screen generating program 24, a screen file 25, an input demand screen 26, an input condition file 27, a link condition extracting program 28, and an analyzing program 29.

When a start request is made from the terminal equipment 20, the knowledge acquisition tool 1 generates question data. When the expert answers in response to the questions generated by the knowledge acquisition tool 1, the answers are stored within the entity data file 21 as (i) name data 8, (ii) macro attribute data 9-i, (iii) micro attribute data 10-i, (iv) data input/output conditions 11, and (v) check conditions 12. In addition, link data related to each data are stored within the link data file 22 when the data are stored within the entity data file 21. The link data is used for giving a network structure and the like.

When the final data judging program 23 judges that the input of the necessary data has ended, the automatic screen generating program 24 automatically generates the screen in the form of a list, table, pattern and the like. This screen which is automatically generated by the automatic screen generating program 24 is stored in the screen file 25 as screen information. A screen 26 which demands an additional input is generated if necessary. The screens are displayed on the terminal equipment 20. When outputting the plan view, for example, the link condition extracting program 28 extracts various link data using the contents of the input condition file 27, and the analyzing program 29 carries out an analyzing process based on the obtained results before making an output.

FIG. 7 is a diagram for explaining the attribute data. In FIG. 7, the macro attribute data group 9 and the micro attribute data group 10 are respectively surrounded by dotted lines.

The attribute data shown in FIG. 7 are the attribute data which are input as the design support tool for the building management system. The micro attribute data such as "user name" "location" "necessity" "capital" "user's characteristic" "keyman name (responsible person on the user side with respect to the design of the building management system)" and "gross sales" are provided and correspond to the macro attribute data "user" which is input. The primitives such as those shown in FIG. 5 described above and corresponding to such micro attribute data are requested as the data to be input.

Therefore, according to this embodiment, it is possible to automatically generate the design support tool. After the design support tool is generated, the desired design can be completed by merely inputting the primitives in steps S18, and S19 as described above, in conjunction with FIG. 3.

Further, the present invention is not limited to these embodiments, but various variations and modifications may be made without departing from the scope of the present invention.

What is claimed is:

1. A data processing system comprising:
    an automatic support tool generating system generating an automatic support tool making a design, comprising a specification, from a general design, said automatic support tool comprising:
    a database comprising knowledge data groups storing knowledge as data, each knowledge data group comprising:
        a design support tool name corresponding to the general design;
        attribute data comprising macro attribute data, in turn comprising micro attribute data,
        input/output conditions related to the micro attribute data, said input/output conditions being stored in a relational type structure,
        check conditions linking the micro attribute data together, said check conditions being stored in a hyper type structure, and
        a design support knowledge data group corresponding to the micro attribute data; and a knowledge acquisition tool, coupled to the database, generating questions and inputting answers comprising the general design, the attribute data, the input/output conditions, and check conditions, to the questions, and acquiring the knowledge from the answers, said knowledge acquisition tool comprising:

general design sequence input processing means for inputting and storing in the database the general design comprising the macro attribute data and mutual relationships of the macro attribute data, detailed design sequence input processing means for inputting and storing in the database the micro attribute data, data input/output condition input processing means for inputting and storing in the database the input/output conditions, and check condition input processing means for inputting and storing in the database the check conditions, wherein the automatic support tool generating system repeatedly generates the questions and inputs the answers until the general design, the attribute data, the input/output conditions, and the check conditions needed by the automatic support tool generating system to generate the design are input, the automatic design tool adding, modifying, and deleting the attribute data, and link data linking the name, the macro attribute data, the micro attribute data, the input/output conditions, and the check conditions are stored within a link data file, form a network structure, and are extracted to produce an output of the automatic design support tool generating system.

2. The data processing system as claimed in claim 1, wherein said general design sequence input processing means stores the macro attribute data in the database in a form of the network type structure, and said detailed design sequence input processing means stores the micro attribute data in the database in a form of a tree type structure which has the macro attribute data as roots.

3. The data processing system as claimed in claim 2, wherein said data input/output condition input processing means stores the macro attribute data obtained from said general design sequence input processing means and the micro attribute data obtained from said detailed design sequence input processing means in the database at least in a form of the relational type structure.

4. The data processing system as claimed in claim 2, wherein said check condition input processing means stores the macro attribute data obtained from said general design sequence input processing means and the micro attribute data obtained from said detailed design sequence input processing means in the database at least in a form of the hyper type structure.

5. The data processing system as claimed in claim 2, wherein the network type structure comprises a final end comprising the attribute data and the tree type structure comprises a final end comprising the attribute data, said automatic tool generating system further comprising display means, having a data display screen for displaying the attribute data on the final end.

6. The data processing system as claimed in claim 5, wherein said knowledge acquisition tool judges whether a necessary content is missing from the data display screen and generates a question related to the necessary content if the necessary content is missing.

7. The data processing system as claimed in claim 6, wherein said knowledge acquisition tool generates a design screen based on the data in the database.

8. The data processing system as claimed in claim 1, wherein the automatic support tool generating system further comprises final input condition/input format automatic generation processing means for making a list of input conditions including information which needs to be finally input when making the design, and for making an estimate.

\* \* \* \* \*

UNITED STATES PATENT AND TRADEMARK OFFICE
CERTIFICATE OF CORRECTION

PATENT NO. : 5,488,732
DATED : JANUARY 30, 1996
INVENTOR(S) : Tadamitsu RYO, et al.

It is certified that error appears in the above-indentified patent and that said Letters Patent is hereby corrected as shown below:

Col. 1,    line 41, "1" should be deleted.

Col. 2,    line 10, "design" should be --design,--;
            line 64, "equipments," should be --equipment,--.

Col. 4,    line 56, "or" should be deleted;
            line 57, "not" should be deleted.

Col. 5,    line 12, "or not" should be deleted.

Signed and Sealed this

Twenty-third Day of July, 1996

*Attest:*

BRUCE LEHMAN

*Attesting Officer*       *Commissioner of Patents and Trademarks*

UNITED STATES PATENT AND TRADEMARK OFFICE
CERTIFICATE OF CORRECTION

PATENT NO. : 5,488,732
DATED : JANUARY 30, 1996
INVENTOR(S) : Tadamitsu RYO, et al.

It is certified that error appears in the above-indentified patent and that said Letters Patent is hereby corrected as shown below:

On the title page, item: [73], Assignee: change "Fujitsu Network Engineering Limited" to --FUJITSU LIMITED--.

Signed and Sealed this

Third Day of December, 1996

*Attest:*

BRUCE LEHMAN

*Attesting Officer*     *Commissioner of Patents and Trademarks*